United States Patent
Knickerbocker, Jr. et al.

(10) Patent No.: US 6,946,923 B2
(45) Date of Patent: Sep. 20, 2005

(54) WIDE RANGE CRYSTAL OSCILLATOR

(75) Inventors: Jerry P. Knickerbocker, Jr., Burlington, VT (US); Vishwanath A. Patil, South Burlington, VA (US); Stephen D. Wyatt, Jericho, VT (US)

(73) Assignee: International Business Machines Corporation, Armonk, NY (US)

(*) Notice: Subject to any disclaimer, the term of this patent is extended or adjusted under 35 U.S.C. 154(b) by 123 days.

(21) Appl. No.: 10/707,118

(22) Filed: Nov. 21, 2003

(65) Prior Publication Data
US 2005/0110587 A1 May 26, 2005

(51) Int. Cl.[7] .............................................. H03B 5/36

(52) U.S. Cl. ...................... 331/160; 331/158; 331/161; 331/182

(58) Field of Search .......................... 331/109, 116 R, 331/116 FE, 116 M, 158–162, 182–183

(56) References Cited

U.S. PATENT DOCUMENTS

| | | | | |
|---|---|---|---|---|
| 4,574,255 A | * | 3/1986 | Fujii et al. | ...................... 331/25 |
| 4,641,109 A | * | 2/1987 | Hiroshi | .................. 331/116 FE |
| 5,150,081 A | * | 9/1992 | Goldberg | ..................... 331/109 |
| 5,331,296 A | * | 7/1994 | Davis | .......................... 331/158 |

* cited by examiner

*Primary Examiner*—David Mis
(74) *Attorney, Agent, or Firm*—Schmeiser, Olsen & Watts; Michael LeStrange

(57) ABSTRACT

A structure and associated method to allow an oscillator circuit to operate with a plurality of different crystals. The oscillator circuit comprises a semiconductor device and a crystal. The semiconductor device comprises a primary inverting amplifier and a crystal substitution damping resistor. The crystal is electrically coupled to the primary inverting amplifier. A resistance value of the crystal substitution resistor is adapted to vary in order to control an amount of current flow from the primary inverting amplifier to the crystal. The amount of the current flow to the crystal is dependent upon an electrical property of the crystal.

20 Claims, 3 Drawing Sheets

WIDE RANGE CRYSTAL OSCILLATOR

BACKGROUND OF INVENTION

1. Technical Field

The present invention relates to a structure and associated method to allow a crystal oscillator circuit operate with a with plurality of different crystals.

2. Related Art

An electrical circuit is typically designed to function with a specific component comprising specific electrical properties. Replacing the specific component with another component that comprises different electrical properties may require major circuit modifications.

Major circuit modifications may be time consuming and costly. Therefore there exists a need to design an electrical circuit to function with different components comprising different electrical properties without making major circuit modifications.

SUMMARY OF INVENTION

The present invention provides an electrical structure, comprising:

a semiconductor device, the semiconductor device comprising a primary inverting amplifier and a crystal substitution resistor; and a crystal electrically coupled to the primary inverting amplifier, a resistance value of the crystal substitution resistor being adapted to vary in order to control an amount of current flow from the primary inverting amplifier to the crystal, the amount of the current flow to the crystal being dependent upon an electrical property of the crystal.

The present invention provides a method, comprising:

providing an electrical structure comprising a semiconductor and a crystal, the semiconductor device comprising a primary inverting amplifier and a crystal substitution resistor, the crystal being device electrically coupled to the primary inverting amplifier;

varying a resistance value of the crystal substitution resistor in order to control an amount of current flow from the primary inverting amplifier to the crystal, the amount of the current flow to the crystal being dependent upon an electrical property of the crystal.

The present invention advantageously provides a structure and associated method to design an electrical circuit to function with different components comprising different electrical properties without making major circuit modifications.

DETAILED DESCRIPTION

Figure 1:
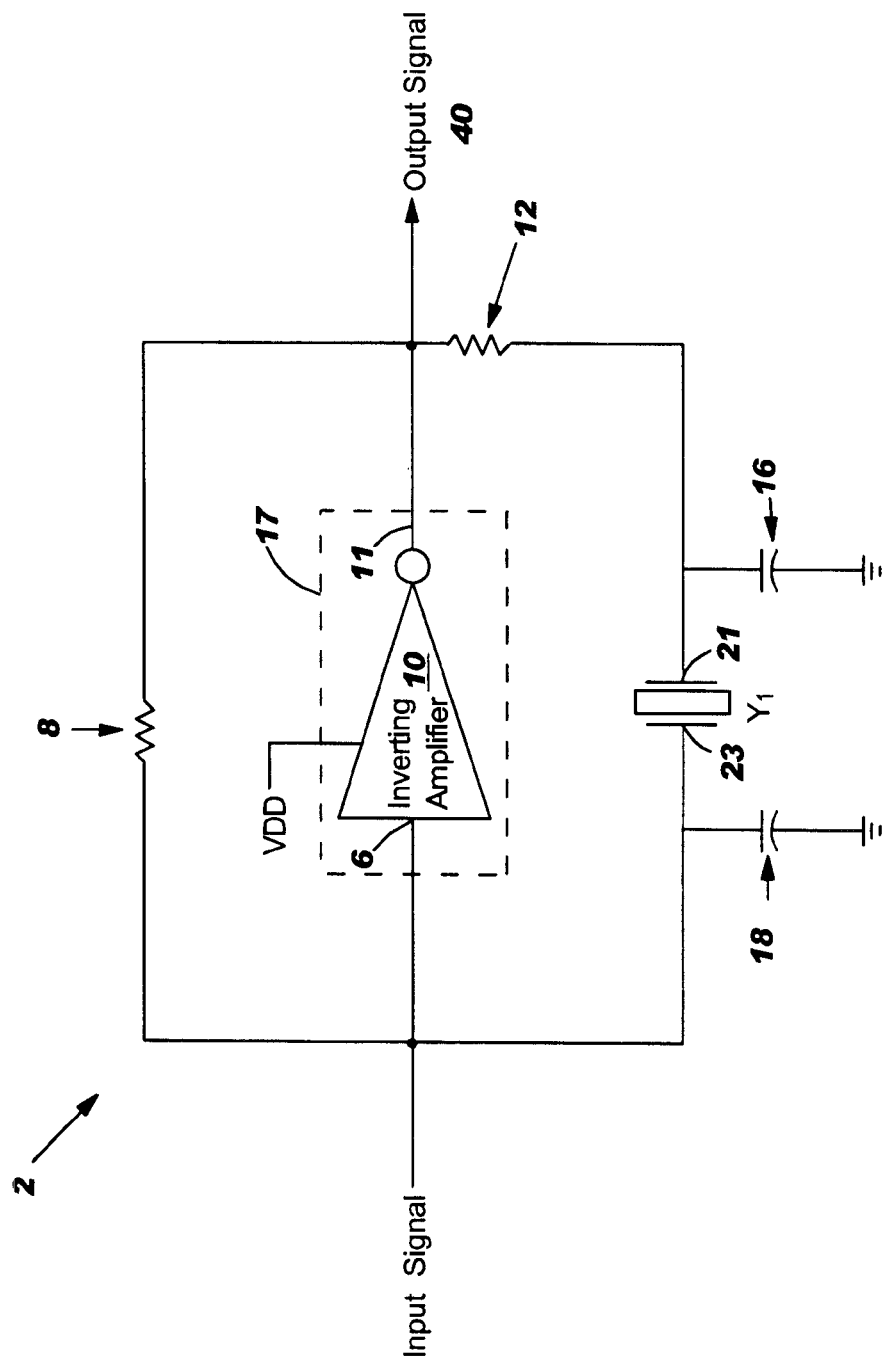
FIG. 1 illustrates a schematic of a crystal oscillator circuit comprising an inverting amplifier and a crystal, in accordance with embodiments of the present invention.

FIG. 1 illustrates a schematic of a crystal oscillator circuit 2 comprising an inverting amplifier 10, a crystal $Y_1$, and a resistor 12, in accordance with embodiments of the present invention. The crystal $Y_1$ may be, inter alia, a quartz crystal. A quartz crystal resonates at a specific frequency ("design frequency") determined by the manner in which the quartz crystal is formed (e.g., cut) and a design of the crystal oscillator circuit 2 (i.e., resistance values for resistors 8 and 12, capacitance values for capacitors 16 and 18, and a voltage gain of the inverting amplifier). Two basic conditions are required for oscillation of the crystal oscillator circuit 2:

1. A phase shift around the oscillator loop (oscillator loop comprises inverting amplifier 10, crystal $Y_1$, resistor 12, and capacitors 16 and 18) of n*360E (n is an integer). The inverting amplifier 10 provides approximately 180° phase shift from the input 6 to the output 11. The network formed by the crystal $Y_1$, the resistor 12, and the capacitors 16 and 18 provide the additional 180° phase shift. Therefore an n*360E phase shift around the oscillator loop is obtained (n is an integer).

2. An open loop gain that is greater than 0 dB.

The inverting amplifier 10 is internal to a semiconductor device 17. The crystal $Y_1$, the resistor 12, the capacitor 16, and the capacitor 18 are external to the semiconductor device 17. A supply voltage VDD is applied to the inverting amplifier 10. The resistor 12 and the crystal $Y_1$ are electrically connected between an output 11 of the inverting amplifier 10 and an input 6 of the inverting amplifier 10. The capacitor 16 is electrically connected between a first side 21 of the crystal $Y_1$ and ground. The capacitor 18 is electrically connected between a second side 23 of the crystal $Y_1$ and ground. The resistor 8 is electrically connected between the output 11 of the inverting amplifier 10 and the input 6 of the inverting amplifier 10. The resistor 8 biases the input 6 of the inverting amplifier 10 from the output 11 of the inverting amplifier 10 for a specified direct current operating point. The resistor 8 may comprise a resistance value that is selected from a range of about 100 Kilohms to about 2 Mega ohms. A feedback signal flows from the output 11 of the inverting amplifier 10 through the resistor 12, the crystal $Y_1$, and back to the input 6 of the inverting amplifier 10. A frequency of the feedback signal is determined by electrical properties (such as, inter alia, design frequency value, Q-factor, power dissipation value, etc) of the crystal $Y_1$. The crystal oscillator circuit 2 produces an output signal 40 at a frequency according to the crystal $Y_1$. The resistor 12 is a current limiting resistor adapted to limit an output of the inverting amplifier so that the crystal $Y_1$ is not over driven (i.e., a power dissipated by the crystal is below a maximum power specification that varies between crystals). The fixed value $R_1$ of the resistor 12 should be about equal to a capacitive reactance of the capacitor 16. The crystal oscillator circuit 2 is designed to operate with one specific design frequency value (or electrical property such as, inter alia, Q-factor, power dissipation value, etc) for the crystal $Y_1$ dependent upon the fixed value $R_1$ of the resistor 12 a fixed value $R_3$ of the resistor 8, a fixed value $C_1$ of the capacitor 16, a fixed value $C_2$ of the capacitor 18, and a gain of the inverting amplifier 10. A programmable oscillator circuit may be designed to operate with different crystals comprising different electrical properties such as inter alia a specific design frequency value of a crystal as described infra in the description of FIG. 2.

Figure 2:
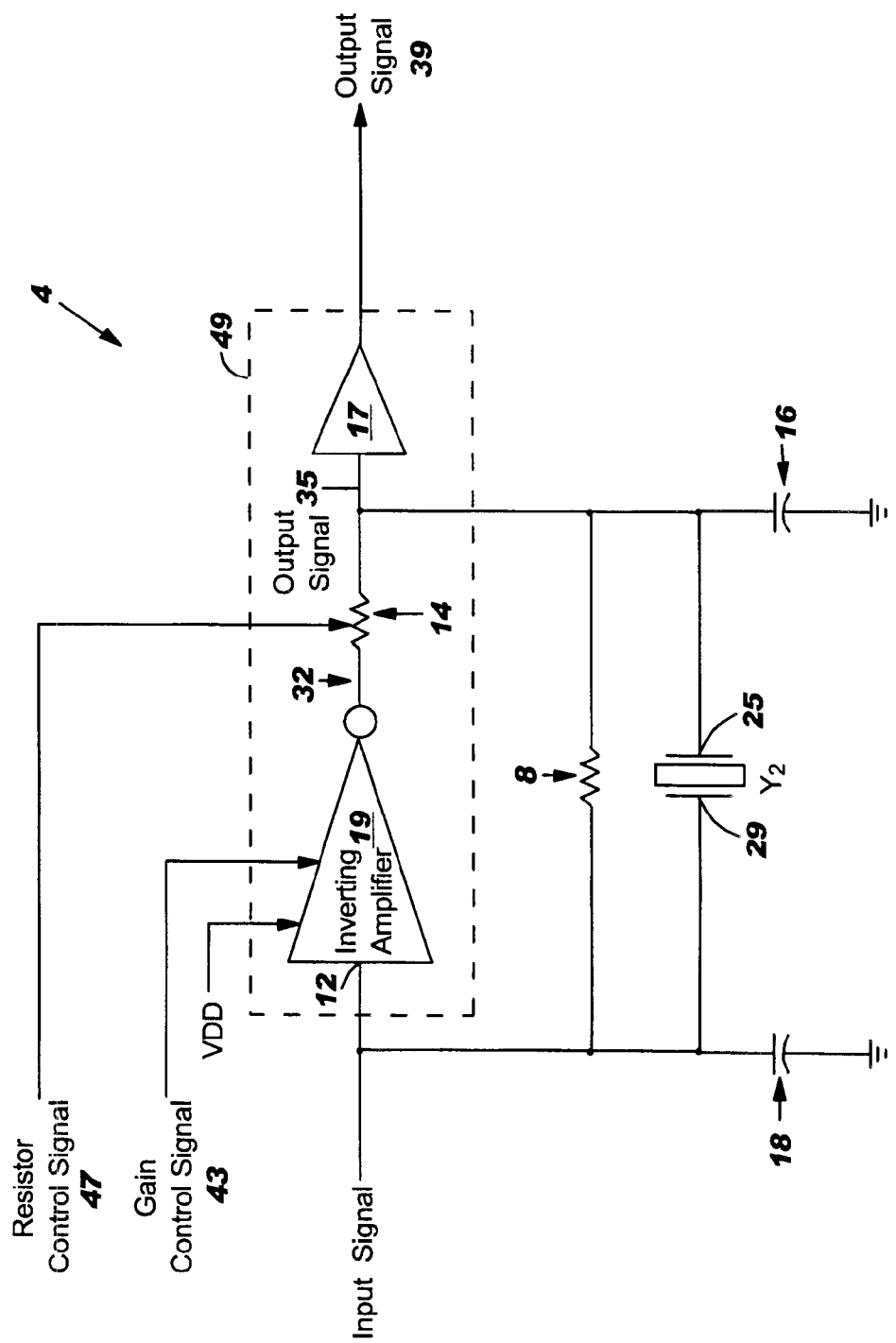
FIG. 2 illustrates a variation of the crystal oscillator circuit 2 of FIG. 1, in accordance with embodiments of the present invention.

FIG. 2 illustrates a variation of the crystal oscillator circuit 2 of FIG. 1 showing a schematic of a programmable crystal oscillator circuit 4 comprising an inverting amplifier 19, a crystal $Y_2$, capacitors 16 and 18, and a variable resistor 14 (i.e. crystal substitution resistor), in accordance with embodiments of the present invention. The crystal $Y_2$ may be, inter alia, a quartz crystal. A supply voltage VDD is applied to the inverting amplifier 19. The variable resistor 14 and the crystal $Y_2$ are electrically connected between an output 32 of the inverting amplifier 19 and an input 12 of the inverting amplifier 19. The capacitor 16 is electrically connected to the crystal $Y_2$. The capacitor 18 is electrically connected to the crystal $Y_2$. The resistor 8 is electrically connected between the output 35 of the inverting amplifier 19 and the input 12 of the inverting amplifier 19. The resistor 8 is electrically connected in parallel with the crystal $Y_2$. The resistor 8 biases the input 12 of the inverting amplifier 19 from the output 35 of the inverting amplifier 19 for a specified direct current operating point. A feedback signal flows from the output 32 of the inverting amplifier 19 through the variable resistor 14, the crystal $Y_2$, and back to the input 12 of the inverting amplifier 19. A frequency of the feedback signal is determined by electrical properties (such as, inter alia, design frequency value, Q-factor, power dissipation value, etc) of the crystal $Y_2$. The adjustable resistor 14 is a current limiting resistor adapted to limit an output 32 of the inverting amplifier 19 so that the crystal $Y_2$ is not overdriven (i.e., a power dissipated by the crystal is below a maximum power specification that varies between crystals). The value $R_2$ of the variable resistor 14 should be about equal to a capacitive reactance of the capacitor 16. The crystal oscillator circuit 4 produces an output signal 35 at a frequency according to the crystal $Y_2$. The crystal buffer 17 is a noise filter for the output signal 35 from the crystal oscillator circuit 4 and produces an output signal 39. In contrast with the crystal oscillator circuit 2 of FIG. 1, the crystal oscillator circuit 4 of FIG. 2 comprises the inverting amplifier 19 with an adjustable gain and the resistor 14 is variable. Additionally, the inverting amplifier 19, the variable resistor 14, and the crystal buffer 17 are internal to a semiconductor device 49. The variable resistor 14 may comprise a plurality of resistors (comprising different resistance values) adapted to be coupled in series and/or parallel to achieve a desired value $R_2$ for the variable resistor 14. A resistor control signal 47 may be applied to the variable resistor 14 to specify the desired value $R_2$. The inverting amplifier 19 may comprise a plurality of secondary inverting amplifiers 3 (see FIG. 3) electrically connected in parallel and the voltage gain of the inverting amplifier 19 may be varied by enabling and/or disabling at least one of the plurality of secondary inverting amplifiers 3 as described in the description of FIG. 3. The variable resistor 14 and the adjustable gain of the inverting amplifier 19 together allow the crystal oscillator circuit 4 to operate with a with plurality of different crystals (e.g., the crystal $Y_2$) that comprise different electrical properties such as, inter alia, design frequency, Q-factor, power dissipation value. By adjusting a gain of the inverting amplifier 19, a target gain value for the oscillator circuit 4 may be achieved regardless of the electrical properties of the crystal $Y_2$. The target gain value for the inverting amplifier 19 may be selected from a range of about 10 decibels (dB) to about 30 dB. A target gain value of about 20 dB is optimal. If the target gain value for the oscillator circuit 4 is too high the crystal $Y_2$ may resonate at an overtone frequency. If the target gain value for the oscillator circuit 4 is too low, oscillation of the crystal oscillator circuit 4 may be prevented. Additionally, if the target gain value for the oscillator circuit 4 is too low, the crystal buffer 17 may be sensitive to noise resulting from slow slew rates caused by the low gain of the crystal oscillator circuit 4. The resistance $R_2$ of the adjustable resistor 14 may be increased in order to limit an amount of current from the output 32 of the inverting amplifier 19 so that a power dissipated by the crystal $Y_2$ is less than a maximum power specification (i.e., power dissipation value) for the crystal $Y_2$. Increasing the resistance $R_2$ tends to reduce the target gain value for the oscillator circuit 4 so the gain of the inverting amplifier 19 may have to be increased to compensate for the increase the resistance $R_2$. A balance between the resistance $R_2$ and the gain of the inverting amplifier 19 must be maintained in order for the oscillator circuit 4 to operate correctly. The resistance $R_2$ of the adjustable resistor 14 may be varied in order to compensate for crystals (i.e., the crystal $Y_2$) that comprise different quality factors (Q-factor). A Q-factor is defined as a ratio of energy stored by the crystal $Y_2$ divided by the energy dissipated by the crystal $Y_2$ and is used to characterize an acoustic loss in the crystal $Y_2$. Since the Q-factor of a crystal is related to an impedance of the crystal, varying the resistance $R_2$ the adjustable resistor 14 allows for the placement of crystals comprising different Q-factors in the oscillator circuit 4.

Figure 3:
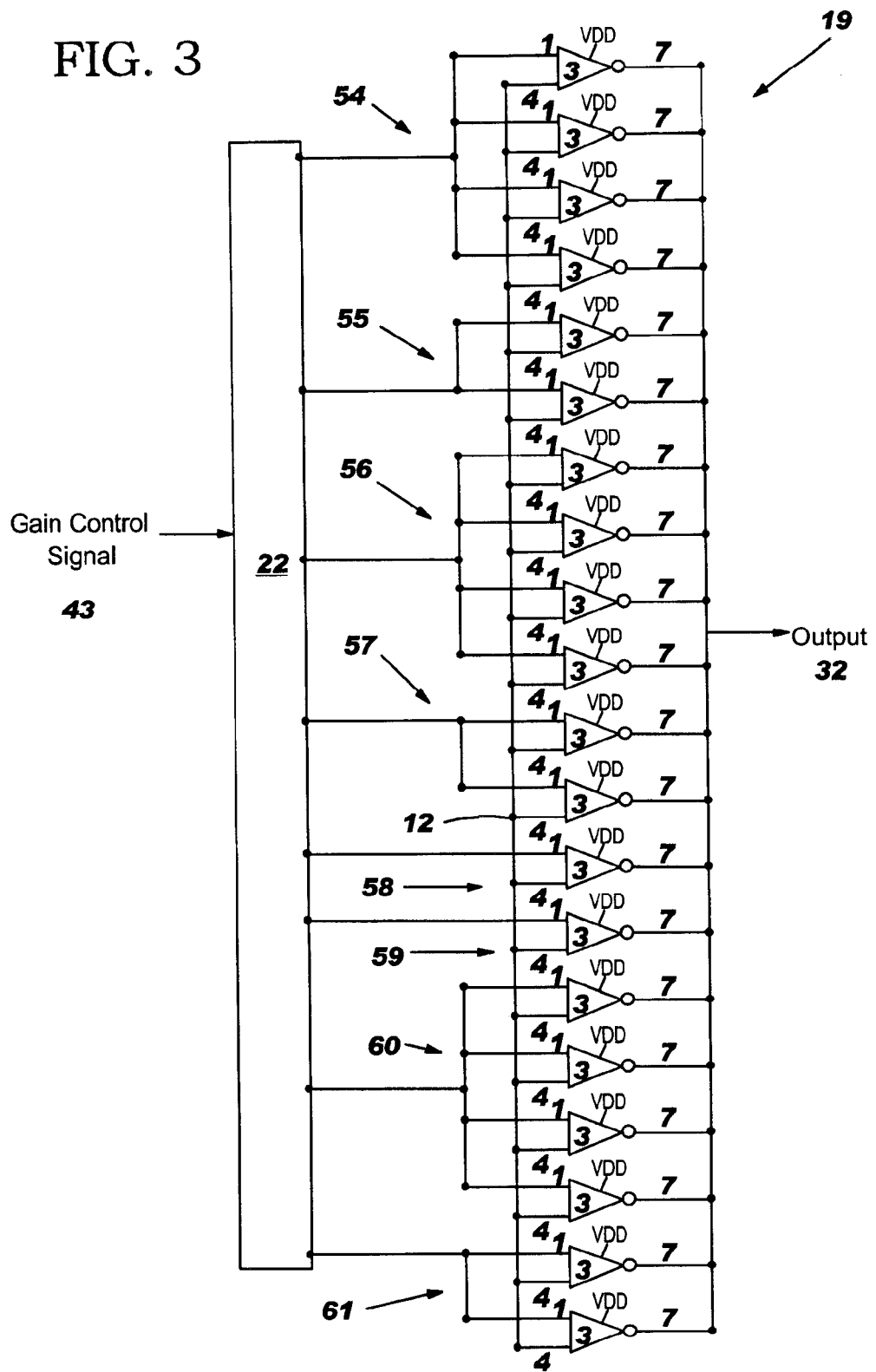
FIG. 3 illustrates an internal schematic of the inverting amplifier of FIG. 2, in accordance with embodiments of the present invention

FIG. 3 illustrates an internal schematic of the inverting amplifier 19 of FIG. 2 comprising a plurality of secondary inverting amplifiers 3, in accordance with embodiments of the present invention. A plurality of input terminals 4 of the plurality of secondary inverting amplifiers 3 are electrically coupled to each other in parallel and collectively represent the input 12 of the inverting amplifier 19 in FIG. 2. A plurality of output terminals 7 of the plurality of secondary inverting amplifiers 3 are electrically coupled to each other in parallel and collectively represent the output 32 of the inverting amplifier 19 in FIG. 2. Each of the plurality of secondary inverting amplifiers 3 comprises an enable terminal 1 adapted to enable or disable each of the secondary inverting amplifiers 3. The plurality of secondary inverting amplifiers 3 are divided into groups 54, 55, 56, 57, 58, 59, 60, and 61. The enable terminals 1 in each of groups 54, 55, 56, 57, 58, 59, 60, and 61 are electrically coupled to each other in parallel. Each of groups 54, 55, 56, 57, 58, 59, 60, and 61 are electrically coupled to a 3–8 bit decoder 22. The 3–8 bit decoder 22 is adapted to accept a 3 bit (combination of logic high and/or logic low) gain control signal 43 and convert the the 3 bit gain control signal into an 8 bit (combination of logic high and/or logic low) gain control signal. Each of groups 54, 55, 56, 57, 58, 59, and 60 receives 1 bit of the 8 bit gain control signal. If any of groups 54, 55, 56, 57, 58, 59, 60, or 61 of the secondary inverting amplifiers 3 receives a logic high bit, the secondary inverting amplifiers 3 in the group(s) receiving the logic high bit are enabled. If any of groups 54, 55, 56, 57, 58, 59, 60 or 61 of the secondary inverting amplifiers 3 receives a logic low bit, the secondary inverting amplifiers 3 in the group(s) receiving the logic low bit are disabled. Therefore the voltage gain of the inverting amplifier 19 is adjusted by enabling and/or disabling the individual groups 54, 55, 56, 57, 58, 59, 60, or 61 of the secondary inverting amplifiers 3 and thereby adding or subtracting the voltage gains of the individual groups 54, 55, 56, 57, 58, 59, 60, or 61 to obtain the voltage gain of the inverting amplifier 19.

The following chart shows a relationship between the gain control signals and a design frequency of the crystal $Y_2$:

| 3 bit control signal | 8 bit control signal | Frequency of crystal $Y_2$ (MHz) |
|---|---|---|
| 000 | 11111111 | 90–100 |
| 001 | 00000100 | .032768 (RTC mode) |
| 010 | 00001100 | 1–5 |
| 011 | 01001100 | 5–20 |
| 100 | 11001100 | 20–60 |
| 101 | 11011100 | 60–70 |
| 110 | 11011101 | 70–80 |
| 111 | 11111101 | 80–90 |

The RTC mode in the previous table is a low gain mode for real time clock applications.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. An electrical structure, comprising:
   a semiconductor device, the semiconductor device comprising a primary inverting amplifier and a crystal substitution resistor; and
   a crystal electrically coupled to the primary inverting amplifier, a resistance value of the crystal substitution resistor being adapted to vary in order to control an amount of current flow from the primary inverting amplifier to the crystal, the amount of the current flow to the crystal being dependent upon electrical properties of the crystal.

2. The electrical structure of claim 1, further comprising a first capacitor, a second capacitor, and a second resistor, wherein a voltage gain of the primary inverting amplifier is variable, and wherein the voltage gain of the inverting amplifier is adapted to be varied dependent upon the electrical properties of the crystal, a capacitance value of the first capacitor, a capacitance value of the second capacitor, and a resistance value of the second resistor.

3. The electrical structure of claim 2, wherein at least one of the electrical properties of the crystal comprises a design frequency value of the crystal.

4. The electrical structure of claim 3, wherein the design frequency value of the crystal is selected from a range of about 32 KHz to about 100 MHz.

5. The electrical structure of claim 2, wherein at least one of the electrical properties of the crystal comprises a quality factor (Q factor) of the crystal.

6. The electrical structure of claim 2, wherein at least one of the electrical properties of the crystal comprises a power dissipation value of the crystal.

7. The electrical structure of claim 2, wherein the voltage gain of the primary inverting amplifier is adapted to be varied to achieve a target gain value selected from a range of about 10 decibels (dB) to about 30 dB.

8. The electrical structure of claim 2, wherein the primary inverting amplifier internally comprises a plurality of secondary inverting amplifiers electrically connected in parallel, and wherein the voltage gain of the primary inverting amplifier is adapted to be varied by enabling at least one of the plurality of secondary inverting amplifiers.

9. The electrical structure of claim 2, wherein the primary inverting amplifier internally comprises a plurality of secondary inverting amplifiers electrically connected in parallel, and wherein the voltage gain of the primary inverting amplifier is adapted to be varied by disabling at least one of the plurality of secondary inverting amplifiers.

10. The electrical structure of claim 2, wherein the primary inverting amplifier internally comprises a plurality of secondary inverting amplifiers, wherein the plurality of secondary inverting amplifiers is divided into a plurality of groups, wherein each group comprises at least two of the plurality of secondary inverting amplifiers electrically connected in parallel, and wherein the voltage gain of the primary inverting amplifier is adapted to be varied by enabling or disabling at least one of said groups.

11. A method, comprising:
   providing an electrical structure comprising a semiconductor and a crystal, the semiconductor device comprising a primary inverting amplifier and a crystal substitution resistor, the crystal being device electrically coupled to the primary inverting amplifier;
   varying a resistance value of the crystal substitution resistor in order to control an amount of current flow from the primary inverting amplifier to the crystal, the amount of the current flow to the crystal being dependent upon electrical properties of the crystal.

12. The method of claim 11, further comprising:
   providing a first capacitor, a second capacitor, and a second resistor; and
   varying a voltage gain of the primary inverting amplifier according to the electrical properties of the crystal, a capacitance value of the first capacitor, a capacitance value of the second capacitor, and a resistance value of the second resistor.

13. The method of claim 12, wherein at least one of the electrical properties of the crystal comprises a design frequency value of the crystal.

14. The method of claim 13, wherein the design frequency value of the crystal is selected from a range of about 32 KHz to about 100 MHz.

15. The method of claim 12, wherein at least one of the electrical properties of the crystal comprises a quality factor (Q factor) of the crystal.

16. The method of claim 12, wherein at least one of the electrical properties of the crystal comprises a power dissipation value of the crystal.

17. The method of claim 12, further comprising varying the voltage gain of the primary inverting amplifier to achieve a target gain value selected from a range of about 10 decibels (dB) to about 30 dB.

18. The method of claim 12, further comprising:
   providing within the primary inverting amplifier, a plurality of secondary inverting amplifiers electrically connected in parallel; and
   varying the voltage gain of the primary inverting amplifier by enabling at least one of the plurality of secondary inverting amplifiers.

19. The method of claim 12, further comprising:
   providing within the primary inverting amplifier, a plurality of secondary inverting amplifiers electrically connected in parallel; and
   varying the voltage gain of the primary inverting amplifier by disabling at least one of the plurality of secondary inverting amplifiers.

20. The method of claim 12, further comprising:
   providing within the primary inverting amplifier, a plurality of secondary inverting amplifiers, wherein the plurality of secondary inverting amplifiers is divided into a plurality of groups, wherein each group comprises at least two of the plurality of secondary inverting amplifiers electrically connected in parallel; and
   varying the voltage gain of the primary inverting amplifier by enabling or disabling at least one of said groups.

* * * * *